(12) United States Patent
Wimplinger et al.

(10) Patent No.: US 11,862,487 B2
(45) Date of Patent: **\*Jan. 2, 2024**

(54) DEVICE AND METHOD FOR BONDING OF TWO SUBSTRATES

(71) Applicant: EV Group E. Thallner GmbH, St. Florian am Inn (AT)

(72) Inventors: Markus Wimplinger, Ried im Innkreis (AT); Florian Kurz, Pram (AT); Viorel Dragoi, St. Florian am Inn (AT)

(73) Assignee: EV Group E. Thallner GmbH, St. Florian am Inn (AT)

( \* ) Notice: Subject to any disclaimer, the term of this patent is extended or adjusted under 35 U.S.C. 154(b) by 0 days.

This patent is subject to a terminal disclaimer.

(21) Appl. No.: 18/083,806

(22) Filed: Dec. 19, 2022

(65) Prior Publication Data
US 2023/0117625 A1 Apr. 20, 2023

Related U.S. Application Data

(63) Continuation of application No. 17/575,101, filed on Jan. 13, 2022, now Pat. No. 11,562,912, which is a continuation of application No. 17/181,632, filed on Feb. 22, 2021, now Pat. No. 11,276,589, which is a continuation of application No. 16/328,793, filed as application No. PCT/EP2016/073304 on Sep. 29, 2016, now Pat. No. 10,964,562.

(51) Int. Cl.
| | |
|---|---|
| *H01L 21/18* | (2006.01) |
| *H01L 21/67* | (2006.01) |
| *H01L 21/20* | (2006.01) |
| *H01L 21/687* | (2006.01) |

(52) U.S. Cl.
CPC ...... *H01L 21/67092* (2013.01); *H01L 21/187* (2013.01); *H01L 21/2007* (2013.01); *H01L 21/68735* (2013.01)

(58) Field of Classification Search
CPC ............. H01L 21/67092; H01L 21/187; H01L 21/2007; H01L 21/68735
USPC ......................................................... 438/455
See application file for complete search history.

(56) References Cited

U.S. PATENT DOCUMENTS

| | | | |
|---|---|---|---|
| 6,008,113 | A | 12/1999 | Ismail et al. |
| 7,645,682 | B2 | 1/2010 | Kerdiles et al. |
| 9,123,754 | B2 | 9/2015 | Shih |
| 9,576,843 | B2 | 2/2017 | Rieutord |
| 9,859,246 | B2 | 1/2018 | Fehkuhrer |
| 10,964,562 | B2 | 3/2021 | Wimplinger |
| 11,276,589 | B2 | 3/2022 | Wimplinger et al. |

(Continued)

FOREIGN PATENT DOCUMENTS

| | | |
|---|---|---|
| CN | 105960706 A | 9/2016 |
| EP | 0899778 A2 | 3/1999 |

(Continued)

OTHER PUBLICATIONS

International Search Report from corresponding International Patent Application No. PCT/EP16/73304, dated Apr. 6, 2017.

(Continued)

*Primary Examiner* — James D Sells
(74) *Attorney, Agent, or Firm* — KUSNER & JAFFE

(57) ABSTRACT

A device, a system and a method for bonding two substrates. A first substrate holder has a recess and an elevation.

11 Claims, 5 Drawing Sheets

(56) References Cited

U.S. PATENT DOCUMENTS

| | | | |
|---|---|---|---|
| 11,562,912 B2* | 1/2023 | Wimplinger | .......... H01L 21/187 |
| 2005/0014347 A1 | 1/2005 | Tomita et al. | |
| 2005/0138800 A1 | 6/2005 | Mayer | |
| 2007/0087531 A1 | 4/2007 | Kirk et al. | |
| 2012/0205024 A1 | 8/2012 | Sugaya et al. | |
| 2013/0105061 A1 | 5/2013 | Castex et al. | |
| 2015/0318260 A1 | 11/2015 | Lin et al. | |

FOREIGN PATENT DOCUMENTS

| | | |
|---|---|---|
| JP | 2007-142381 A | 6/2007 |
| JP | 2010-118483 A | 5/2010 |
| JP | 2013-120901 A | 6/2013 |
| JP | 2015-515151 A | 5/2015 |
| JP | 2017-168473 A | 9/2017 |
| TW | 201351543 A | 12/2013 |
| WO | WO 2014/191033 A1 | 12/2014 |
| WO | WO 2015-113641 A1 | 8/2015 |
| WO | WO 2016/096025 A1 | 6/2016 |
| WO | WO 2017/1430347 A1 | 8/2017 |
| WO | WO 2017/162272 A1 | 9/2017 |

OTHER PUBLICATIONS

Castex et al., "Mechanism of Edge bonding Void Formation in Hydrophilic Direct Wafer Bonding," ECS Solid State Letters, Mar. 24, 2013, pp. 47-50.

Office Action (and its English-language translation) dated Feb. 16, 2022 from corresponding Japanese Appl. No. 2021-026099.

* cited by examiner

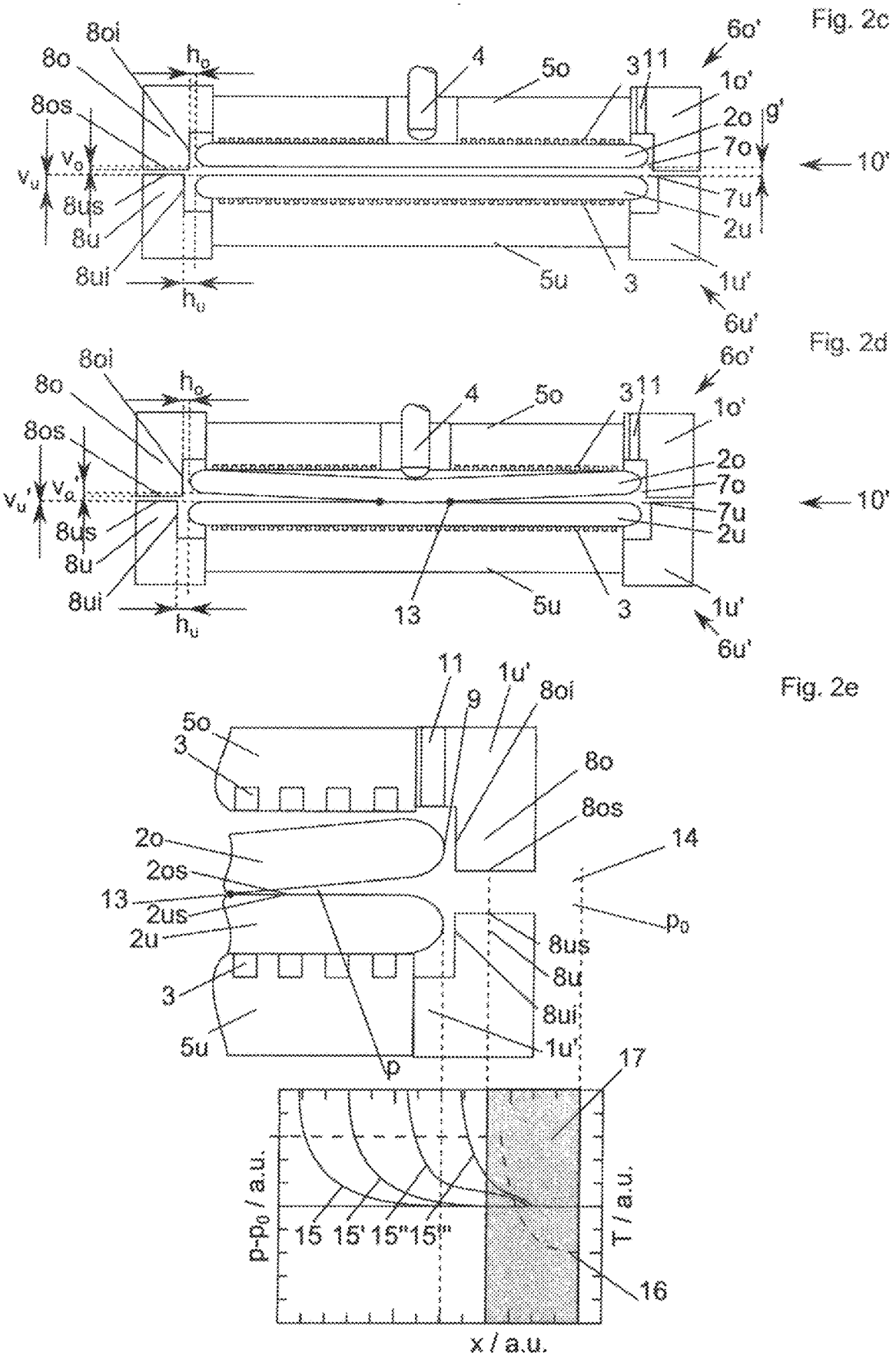

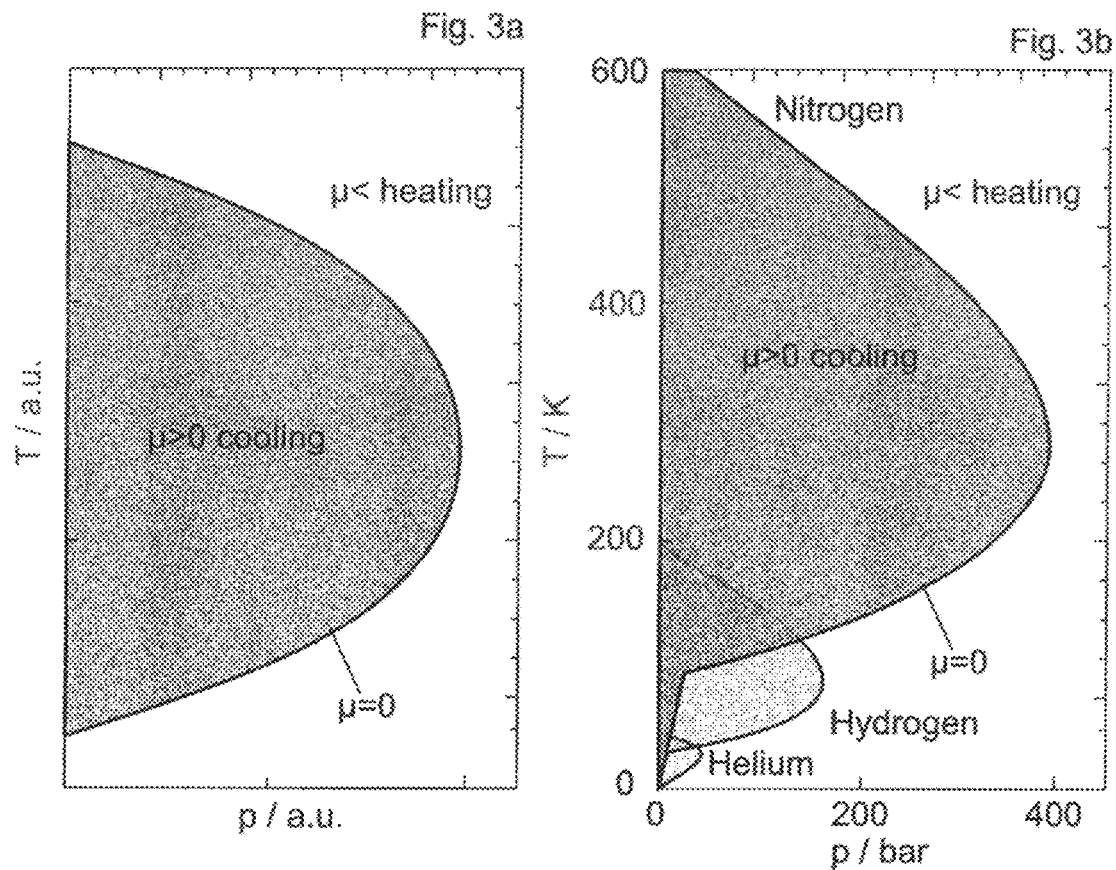
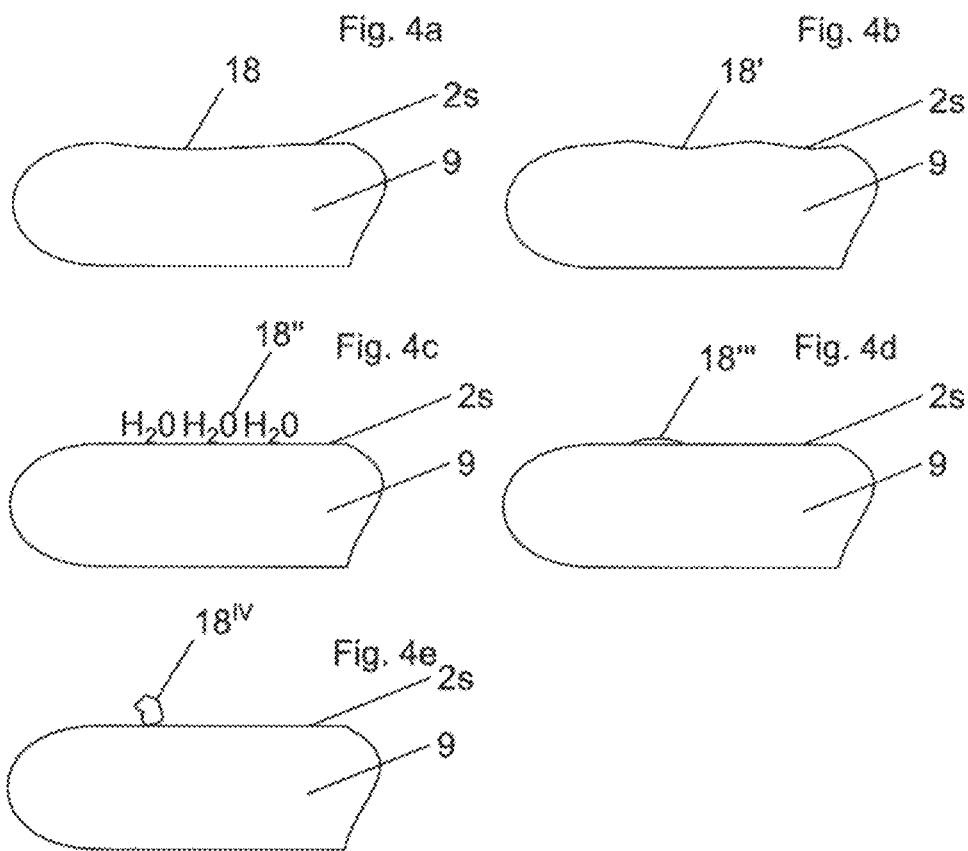

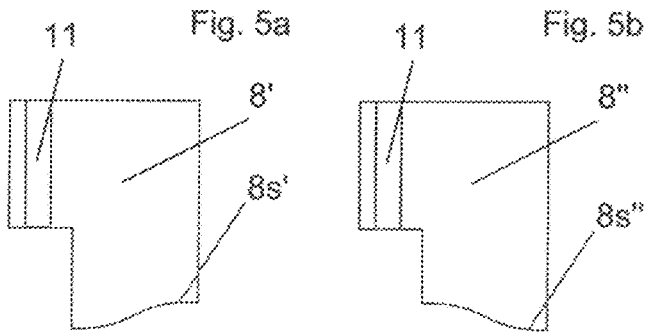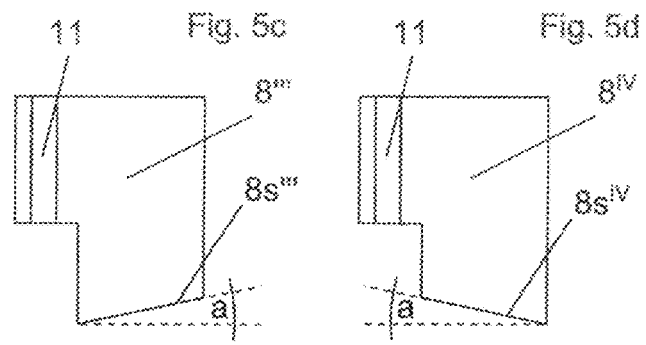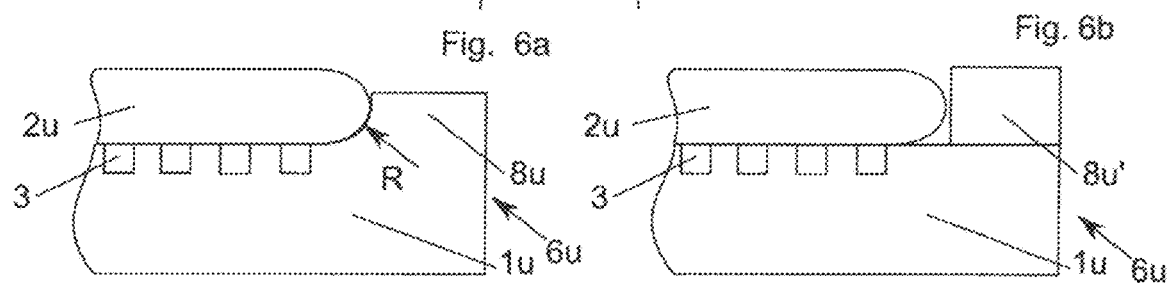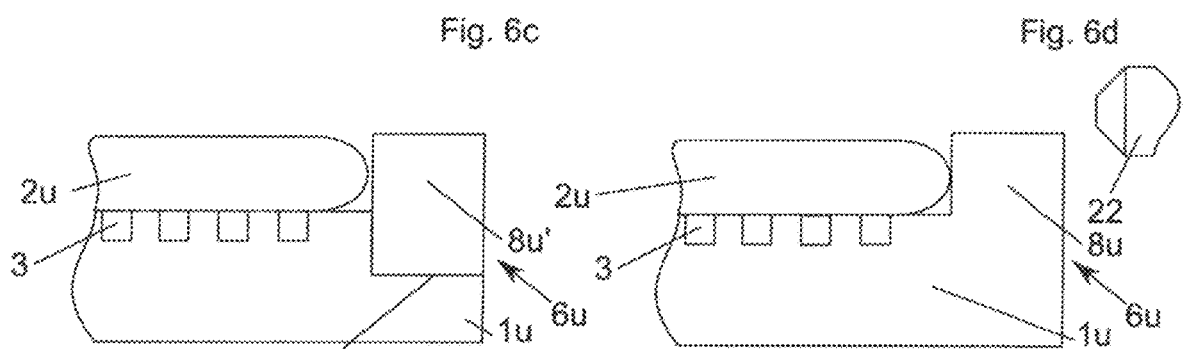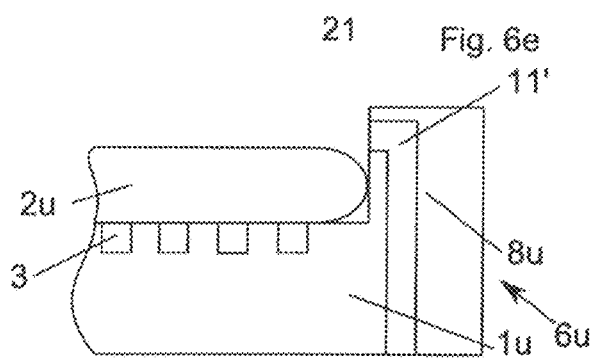

DEVICE AND METHOD FOR BONDING OF TWO SUBSTRATES

RELATED APPLICATIONS

The present invention is continuation of U.S. application Ser. No. 17/575,101, filed Jan. 23, 2022, which is a continuation of U.S. application Ser. No. 17/181,632, filed Feb. 22, 2021 (now U.S. Pat. No. 11,276,589, issued Mar. 15, 2022), which is a continuation of U.S. application Ser. No. 16/328,793, filed Feb. 27, 2019 (now U.S. Pat. No. 10,964,562, issued Mar. 30, 2021), which is a U.S. National Stage Application of International Application No. PCT/EP2016/073304, filed Sep. 29, 2016, said patent applications hereby fully incorporated herein by reference.

FIELD OF THE INVENTION

The present invention relates generally to a thermal management system, and more particularly to a thermal management system adapted for use in low temperature environments.

BACKGROUND OF THE INVENTION

In the prior art, substrates have been joined to one another by so-called bonding processes for a number of years. In particular, the direct bonding of two surfaces at room temperature, in which a so-called pre-bond is formed first, followed by a subsequent heat treatment step, is of immense interest for the semiconductor industry.

This bonding method is known as direct or fusion bonding. With the aid of fusion bonding, one is able to fix the substrate surfaces to one another immediately, following an alignment process which aligns both substrates with respect to one another. In this case, one makes use in a targeted manner of the adhesion capabilities of the surfaces, particularly the hydrophilicity. The substrates are first brought closer to one another until they are a very small distance apart. Then the, in particular upper, substrate is bent so that the two substrates touch one another, ideally in a punctiform manner Shortly thereafter, the fixing of the, in particular upper, substrate is released. By means of gravitation and/or a targeted control, a bond wave propagates from the contact point, which creates whole-area contact and thus a whole-area pre-bond of the two substrates. During the propagation process of the bond wave, all gases upstream of the bond wave are compressed and pushed ahead of the bond wave. The bond interface remains, at least for the most part, free from gas inclusions.

A phenomenon which occurs very often during the creation of pre-bonds are what are known as edge defects, particularly edge voids. These edge voids are gas inclusions which arise if the gas liquefies owing to a changed physical state. The bond wave then propagates beyond the liquefied gas and locally encloses the same. After the pre-bond has been created, the physical state changes anew, which leads to an evaporation of the previously condensed gas. This evaporation then leads to local destruction of the pre-bond, which is clearly detectable by means of ultrasonic measurement or infrared measurement. Castex et al., *Mechanism of Edge Bonding Void Formation in Hydrophilie Direct, ECS Solid State Letters,* 2 (6) P47-P50 (2013) describes in great detail how the condensation of the gas occurs upstream of the bond wave.

Substrate surfaces are never completely pure. The different atoms and molecules are adsorbed on substrate surfaces, even if only in a single monolayer. Because all atmospheres contain a not insignificantly small proportion of water vapour, water is one of the dominant components of substrate surface contamination. Furthermore, organic substances, even particles or atomic or molecular gases such as oxygen, nitrogen or helium may adhere to the substrate surface. In this published document, primarily an installation and methods are shown, in order to remove gases, particularly water, from the substrate surface or to prevent the same from condensing. It is assumed that the substrate surface is free from organic components, especially from particles.

Gases, particularly however also gas mixtures, have a Joule-Thompson coefficient (JTC) which is dependent on pressure and temperature. The JTC determines whether a gas or a gas mixture experiences cooling or heating in the event of isenthalpic expansion.

An isenthalpic expansion is understood to mean the transition of a gas or gas mixture from a first, compressed state to a second, less compressed state, in which the enthalpy of the gas is retained. Gases or gas mixtures which have a positive JTC have the property of cooling down during an isenthalpic expansion. Gases or gas mixtures which have a negative JTC have the property of heating up during an isenthalpic expansion. The underlying physical effect is the attraction or repulsion capacity of the molecules. If the molecules attract one another at a predetermined temperature, work must be done, i.e. energy must be used to separate them from one another. This work is removed from the system, therefore reduces the speed of the molecules and thus reduces the temperature. If the molecules repel at a predetermined temperature, work is performed by the system, i.e. energy is released. This released energy thus increases the speed of the molecules and thus increases the temperature.

The published document Castex et al., *Mechanism of Edge Bonding Void Formation in Hydrophilie Direct, ECS Solid State Letters,* 2 (6) P47-P50 (2013) describes very precisely which physical processes occur in the vicinity of the substrate edge. In a simplified manner, it should be mentioned that the gas or gas mixture undergoes a very high pressure drop at the outlet of the substrate wiping space. Due to the fact that the process takes place within a fraction of a second, the energy can not be dissipated quickly enough and the process can be regarded as isenthalpic. Consequently, the JTC of the gas or gas mixture decides whether cooling or heating of the gas or gas mixture takes place during the isenthalpic expansion. The cooling of the gas or gas mixture can be so strong that the dew point of the gas or gas mixture is undershot and the gas or gas mixture or individual components of the gas mixture condense. The substrate surface serves as a crystallization nucleus. It is therefore a heterogeneous nucleation which has an even lower nucleation energy than a homogeneous nucleation in the gas phase. This physical process of condensation must be avoided.

It is therefore the object of the present invention to overcome the disadvantages of the prior art and in particular to achieve an improved bond result.

SUMMARY OF THE INVENTION

Objects of the present invention are achieved with the subject matter of the coordinate patent claims. Advantageous developments of the invention are specified in the dependent claims. All combinations of at least two features specified in the description, the claims and/or the drawings also fall within the scope of the invention. In the case of value ranges, values lying within the limits mentioned should also be disclosed as limit values and be claimable in any desired combination.

The core idea of the invention is that the substrate surface or the substrate surfaces are widened in such a manner that the gas which is displaced from the centre outwards during the bonding process does not already expand at the edge between the substrates but rather the expansion of the gas only takes place outside of the two substrates. In other words: the gas is still forced out of the intermediate space between the substrates with increased pressure, and the pressure drop or expansion only takes place when the surrounding elevation or the expansion surface has been reached or the gas has run beyond or been pushed beyond the elevation or the expansion surface.

The substrates may have any desired shape, but are preferably circular. The diameter of the substrates is in particular industrially standardized. For wafers, the industry-standard diameters are 1 inch, 2 inches, 3 inches, 4 inches, 5 inches, 6 inches, 8 inches, 12 inches and 18 inches. The embodiment according to the invention may however fundamentally handle any substrate, independently of the diameter thereof.

According to the invention, the device for bonding a first substrate surface of a first substrate to a second substrate surface of a second substrate has:
 a first substrate holder for accommodating the first substrate,
 a second substrate holder for accommodating the second substrate,
wherein at least the first substrate holder has a first recess with a fixing device for fixing the first substrate in the first recess, as well as an elevation at least partly surrounding the recess.

According to the invention, a system is furthermore provided, which is made up of a device according to the invention and the first substrate, wherein the first substrate surface merges into the elevation.

Furthermore provided according to the invention is a method for bonding a first substrate surface of a first substrate to a second substrate surface of a second substrate by means of a device according to the invention, wherein a gas arranged between the substrate surfaces during the bonding process is displaced from a centre to the edge of the substrates, wherein the first substrate surface merges into the elevation in such a manner that an expansion of the gas only takes place outside the substrates and/or the difference $p-p_0$ of a pressure p at the substrate edge at the end of the bonding process and an ambient pressure $p_0$ is greater than zero.

Advantageously, the condensation of a gas or gas mixture driven forth between the substrates and upstream of the bond wave can be prevented so that it does not lead to the formation of a condensed phase and thus edge voids are not formed. The substrate surfaces of the substrates are widened in such a way so that the physical effects responsible for the creation of the edge voids advantageously take place outside the substrate surfaces.

An advantage of the invention therefore includes the reduction, in particular total prevention, of edge voids in fusion-bonded substrates.

All the embodiments and processes according to the invention mentioned can be combined with one another as desired, but are described individually.

It is preferably provided that both the first substrate holder and the second substrate holder have a recess with a fixing device. Preferably, both substrate holders have an elevation at least partly surrounding the recess.

Preferably, the elevation or the elevations run at least somewhat annularly around the recess. The elevation can in particular be formed annularly around the recess.

The following statements are made for the first substrate holder or a substrate holder. However, the aspects or embodiments equally apply for a device according to the invention in which both substrate holders are provided with a recess and an elevation.

It is furthermore preferably provided that the elevation has an expansion surface for, in particular, seamless expansion of the first substrate surface. As a result, a particularly efficient transition of the gas from the substrate surface to the expansion surface is advantageously possible.

It is furthermore preferably provided that the recess and/or the elevation is/are adapted to the first substrate, in particular to the shape of the first substrate, in such a manner that the substrate surface with the expansion surface forms a substantially continuous surface and/or merges into the elevation. As a result, a particularly good adaptation of the recess and/or the elevation to the substrate surface is advantageously possible, so that the gas can be forwarded particularly efficiently.

Furthermore, it is preferably provided that the recess and/or the elevation can be adapted manually and/or semi-automatically and/or automatically in such a manner that the substrate surface with the expansion surface forms a substantially continuous surface and/or merges into the elevation. As a result, it is advantageously possible to variably adapt the recess and/or the elevation to the substrate surface. By means of this adjustability, different substrates can be processed with the device. An exchange of the device can be avoided as a result.

It is furthermore preferably provided that the first substrate holder has an outer component and an inner component which is movable in the outer component, wherein the outer and/or inner component is movable in a translational and/or rotary manner, wherein the components can be fixed to one another. Due to the movability, it is advantageously possible that the loading of the device with the substrate can be simplified considerably. In addition, the distances between the substrates or between the substrate surfaces and the elevations or expansion surfaces can be set in a variable manner.

It is furthermore preferably provided that the vertical distance between the first substrate surface and the expansion surface can be adjusted. As a result, it is advantageously possible that the vertical distance can be set optimally, so that the gas transitions particularly efficiently from the substrate surface to the expansion surface.

Furthermore, a device is preferably provided, having at least one hole for evacuating and/or rinsing the recess, wherein preferably a plurality of holes are preferably arranged in a symmetrically distributed manner, in particular in the inner component.

Due to the possibility of evacuating and/or flushing the recess, it is advantageously possible that the displaced gas is influenced in such a manner that the transition from the substrate surface to the elevation or the expansion surface can be improved. Furthermore, the holes can be used to build up an overpressure around or in the vicinity of the recesses, in particular in the transition region between the substrate peripheries and the expansion surface. This additionally generated overpressure prevents a pressure drop or an expansion of the gas or the gas mixture from occurring in this region. The pressure in this range is, in particular, greater than 1 bar, preferably greater than 2 bar, more preferably greater than 4 bar, most preferably greater than 6 bar, most preferably of all greater than 10 bar.

It is furthermore preferably provided that the elevation has an inwardly and/or outwardly curved expansion surface. Due to the curvature inwards and/or outwards, the displaced gas can be further influenced. In the event that the volume is reduced to the outside or that the expansion surface is curved outwards, the effect of a throttle valve is achieved thermodynamically. In other words: with the geometry of the expansion surface, the displaced gas can be influenced so that it can be compressed or expanded.

It is furthermore preferably provided that the elevation has an expansion surface which is inwardly and/or outwardly bevelled at an angle. In principle, similar applies here as for the curved expansion surface. By defining a specific angle a of the bevel to the horizontal, an optimum influencing of the gas can be achieved.

Installations and Substrate Holders

The substrate holders mentioned in the further statements each form a device according to the invention.

The fixing device comprises, in particular mechanical fixings, particularly clamps vacuum fixings, particularly with individually controllable vacuum ducts vacuum ducts which are connected to one another electrical fixings, particularly electrostatic fixings magnetic fixings adhesive fixings, particularly Gel-Pak fixings Fixings with adhesive, in particular controllable, substrate surfaces.

The fixings are, in particular, electronically controllable. Vacuum fixing is the preferred type of fixing. The vacuum fixing preferably includes a plurality of vacuum ducts which emerge from the substrate surface of the substrate holder. The vacuum ducts can preferably be controlled individually. In a use, which is more realizable from a technical standpoint, some vacuum ducts are combined into vacuum duct segments, which can be controlled individually, therefore evacuated or flooded. However, each vacuum segment is independent of the other vacuum segments. Thus, one is afforded the option of building individually controllable vacuum segments. The vacuum segments are preferably of annular construction. As a result, a targeted, radially symmetrical, fixing and/or detachment of a substrate from the sample holder, which is carried out from the inside outwards in particular, is enabled. In particular, reference is made to the possibility of vacuum zones from the published document PCT/EP2016056249. Furthermore, the use of a pin chuck is disclosed. A substrate holder of this type has been described in detail in WO2015113641 A1. The use of such a substrate holder is advantageous in order to enable a smallest possible contact surface between the substrate and the substrate holder, so that the contamination of the substrate rear side is reduced to a minimum or so that no contamination takes place at all.

In general, two substrate holders exist for each device according to the invention. The two substrate holders are generally not completely identical, as at least one of the substrate holders has one or more deformation elements in order to be able to deform one of the substrates. Each substrate holder is therefore described in detail.

In a first embodiment according to the invention, the solution to the technical problem includes widening the substrate surface by means of an expansion surface, in particular seamlessly, so that the pressure drop does not take place in the vicinity of the substrate edge. According to the invention, a substrate holder is therefore disclosed which, in particular, has a recess adapted to the substrate. The substrate is fixed in the recess and the substrate surface with the expansion surface forms a more or less continuous new widened surface.

The first, in particular lower, substrate holder has a recess, in particular adapted to the shape of the substrate. The outer substrate periphery of the first substrate has a horizontal distance hu from the inner wall of an elevation of the first component. The substrate surface of the first substrate has a vertical distance vu from the expansion surface of the first component.

The fixings fix the substrate.

The second, in particular upper, substrate holder has a recess, in particular adapted to the shape of the substrate. The outer substrate periphery of the second substrate has a horizontal distance ho from the inner wall of the upper component. The substrate surface of the second substrate has a vertical distance vo from the surface of the upper component. The fixings fix the substrate. In addition, a deformation means is preferably installed, using which one can deform the second substrate.

In a second embodiment according to the invention, the solution to the technical problem likewise includes widening the substrate surface by means of an expansion surface, in particular seamlessly, so that the pressure drop does not take place in the vicinity of the substrate edge. According to the invention, a substrate holder is disclosed, however, which, in particular, has a recess which can be adapted to the substrate.

The first, in particular lower, substrate holder includes at least two components. The first component has a recess which can be adapted in particular to the shape of the substrate. The outer substrate periphery of the first substrate has a horizontal distance hu from the inner wall of the lower component. The substrate surface of the first substrate has a vertical distance vu from the surface of the first component. The fixings fix the substrate.

The second, in particular upper, substrate holder has a recess, which can in particular be adapted to the shape of the substrate. The outer substrate periphery of the second substrate has a horizontal distance ho from the inner wall of the upper component. The substrate surface of the first substrate has a vertical distance vo from the initial surface of the first component. The fixings fix the substrate. In addition, a deformation means is preferably installed, using which one can deform the second substrate.

The recess can in particular be varied manually and/or semi-automatically and/or fully automatically. In particular, the first substrate holder includes a first outer component and a second, second component, which can be moved in the outer component. The two components can be moved relative to each other translationally, in particular also rotatably. In particular, the two components can also be fixed to each other. Due to the possibility of the relative displaceability of the two components, the height position, in particular also the rotational position, of the first and/or second substrate can be set as precisely as possible. Due to the development of the substrate holders according to the invention by at least two components, the vertical distances vu and v0 can be dynamically adapted in order to achieve optimum bond results.

General Definition

The first substrate holder may likewise have deformation means or may be constructed such that pre-bending of the first substrate may be performed. Such pre-bends can positively influence a provided fusion bond. A detailed description of such deformation means can be found in WO2014191033A1.

All of the distances hu, ho, vu, vo mentioned are smaller than 5 mm, preferably smaller than 1 mm, more preferably smaller than 0.5 mm, most preferably smaller than 100 μm, absolutely most preferably smaller than 10 μm. The distances hu and ho are particularly preferably identical. The distances vu and vo are particularly preferably identical. The distances hu, ho, vu, vo are very particularly preferably identical.

It is technically extremely challenging or expensive to construct the distances hu, ho, vu, vo so precisely that a seamless transition of the gas or gas mixture from the region between the substrates takes place via the expansion surface to the outside. For this reason, the distances hu, ho, vu, vo are chosen as small as possible for the process according to the invention and, in addition, for a sufficiently high overpressure is provided in the recessses in such a way that condensation of a gas never occurs in the vicinity of the substrate peripheries.

The pressure in the vicinity of the substrate peripheries therefore has to be at least equal or at least similar to the gas or gas mixture pressure from the region between the substrates, particularly at the time the bond wave approaches. The pressure difference between two pressures is in particular 2 bar, preferably smaller than 1 bar, more preferably smaller than 0.1 bar, most preferably smaller than 0.01 mbar, most preferably of all smaller than 10E-3 mbar.

The additional overpressure in the recesses is generated in particular by a gas or gas mixture, which is directed via the holes of one of the substrate holders. In particular, this is a gas or gas mixture, which heats up during an isenthalpic expansion, and therefore has a negative JTC, since this gas or gas mixture is indeed mixed with the gas or gas mixture from the region between the substrates and is transported to the outside via the expansion surface.

Should an isenthalpic expansion occur already on the way there, the introduced gas or gas mixture can counteract the condensation of other gases by a temperature increase. The temperature increase in the region between the substrates should in particular be so high that the temperature is more than 0.1° C., preferably more than 0.5° C., more preferably more than 5° C., most preferably more than 10° C., most preferably of all more than 20° C. above the condensation temperature of the gas or gas mixture.

All substrate holders according to the invention can have holes through which evacuation and/or flushing of the interior space, in particular the recess, can take place. In particular, a plurality of holes, which are arranged symmetrically in one of the components, in particular in the first component, are conceivable. The number of holes is 1, preferably 2, more preferably more than 5, most preferably more than 10, most preferably of all more than 25. The use of a plurality of holes is particularly important in order to be able to perform a symmetrical evacuation and/or flushing of the interior.

All of said substrate holders, in particular the lower ones, can still have loading elements, in particular loading pins, which facilitate the loading and unloading of the substrates. In the drawings, the illustration thereof is dispensed with in order to obtain clarity.

All embodiments can be preceded by an evacuation of the interior of the installation according to the invention. In particular, the pressure is reduced to less than 1 bar, preferably less than 0.1 mbar, more preferably less than $10^{-3}$ mbar, most preferably less than $10^{-5}$ mbar, most preferably less than $10^{-7}$ mbar. The evacuation of the interior space is accompanied by a removal of a multiplicity of components which can lead to defects, in particular the condensations treated according to the invention, for the following pre-bonding step. Irrespective of the duration and the strength of the evacuation, a few components, especially those which are adhesively bonded to the substrate surfaces, in particular water, will remain, which cannot be removed by a simple evacuation step.

Furthermore, evacuation and flushing can be carried out several times in order to improve the quality of the atmosphere.

This is understood to mean, for example, the replacement of air components with a gas or gas mixture, in particular an inert gas such as helium, which has, in particular, an JTC which leads to heating in the case of an isenthalpic expansion. An atmosphere is then regarded as all the purer, the higher the proportion of this gas or gas mixture. The quality of the atmosphere is in particular greater than 50%, preferably greater than 75%, more preferably greater than 85%, most preferably greater than 95%, most preferably of all greater than 99%. The process is, in particular, carried out with at least one of the gases used in one of the following extended embodiments.

In a further embodiment, the interior, in particular the recesses, is rinsed with a gas or a gas mixture before and/or during and/or after the bonding, which ensures that the temperature drop of the gases which are forced out of the substrate intermediate region, in particular isenthalpically expanding, is so small, preferably is suppressed even so far as to prevent condensation of the gases or gas mixtures on the substrate surfaces. In principle, any gas suitable for this purpose, in particular helium, hydrogen and neon, can be used. Because of its very small inversion curve, helium is mentioned as an exemplary example.

In a further embodiment according to the invention, a temperature drop of isenthalpic expansion is achieved by heating the edge, in particular the expansion surface. The expansion surface can thereby be heated to temperatures of more than 25° C., preferably more than 50° C., more preferably more than 100° C., most preferably more than 150° C., most preferably more than 200° C. The heating of the expansion surface can also be combined with all other aspects mentioned according to the invention.

In a further embodiment according to the invention, a targeted selection of the gap g between the two expansion surfaces of the lower and upper substrate holder ensures that the overpressure in the interior of the two substrate holders, in particular in the region of the recesses, is increased by the progress of the bond wave and the gas or gas mixture displaced therewith. For this, it is necessary that the interior is closed at this time. In particular, the holes must be closed. In a particularly preferred embodiment, the holes are completely closed or even not constructed in order to keep the volume of the interior as small as possible.

In order to counteract the condensation, the temperature in the gas mixture, in which the condensing gas in particular is located, must be increased. According to the inversion graph for helium, helium has a very small region with positive JTC and an extremely large region with a negative JTC. Helium therefore always has a negative JTC, particularly under moderate conditions, i.e. at about 298 Kelvin and in the pressure range of 1-10 bar, which is assumed for the condensing gas before isenthalpic expansion. Helium, therefore, when it is isenthalpically expanded under the above-mentioned conditions, will heat up and thus counteract condensation of the condensing gas. Another excellent gas for the project would be hydrogen. The inversion curve for hydrogen is likewise below approx. 298 Kelvin and is therefore likewise suitable for the use according to the invention as a temperature-increasing gas with isenthalpic expansion. Furthermore, hydrogen has reducing properties as opposed to inert helium. In order to achieve the same effect according to the invention with nitrogen at 298 Kelvin, the gas mixture would have to be increased to a pressure beyond 400 bar, which would be technically difficult to realize.

In a further embodiment, the substrates are heat-treated before the bonding process in an embodiment according to the invention. The heat treatment is carried out on a heating plate and/or in a furnace, in particular a continuous furnace. The heat treatment in particular has the function of removing gases and/or chemical residues on the substrate surface by means of energy input. Preferably, the heat treatment is carried out in a vacuum environment in order to largely prevent a renewed adhesion of gases. In a particularly preferred embodiment according to the invention, the substrates are overflowed by a hot medium, in particular fluid. The overflow of the substrate surface with a hot fluid has the advantage that not only molecules are resorbed from the substrate surface due to the thermal movement, but are also entrained by the fluid stream and are therefore removed from the substrate surface.

In a further embodiment, the substrates are plasma-treated. The plasma treatment has, above all, the advantage that the substrate surfaces are terminated. Termination refers to the targeted attachment of molecules with certain properties on the substrate surface. The substrate surface should in particular be rendered hydrophobic, i.e. lose the hydrophilicity thereof. By reducing the hydrophilicity, the adhesion of gases, in particular polar gases, most preferably of water vapour, is rendered more difficult, if not prevented.

In a particularly preferred embodiment, the plasma treatment is carried out in such a manner that the hydrophilicity is only reduced but not completely lost. This results in less water adhering to the surface.

In a further embodiment, the substrate surfaces are modified in such a way that the bond wave spreads more slowly. Due to a slower propagation of the bond wave, the gas has more time to expand and the pressure build-up between the substrates could be significantly reduced. Advantageously, the aspect that the bond wave is evenly distributed over the substrate edge can also be used to prevent irregular distortions being built up on the substrate edge. Methods for influencing the bond wave speed are explicitly mentioned in the published document PCT/EP2016053268.

In a further embodiment, the substrate surfaces are cleaned in a wet chemical manner, in particular after a plasma treatment. The task of wet cleaning primarily has the task of terminating the plasma-activated substrate surfaces. Through this process, the hydrophilicity and thus the amount of adsorbed water can also be adjusted in a targeted manner.

In a further embodiment of the device according to the invention, surface enlarging means are used instead of the substrate holders. The aim of the surface enlarging means is to provide an auxiliary device with which the method for minimizing the edge defects can be used in conventional fusion bonding devices. Different surface enlarging means preferably enclose one of the two substrates all around the outer edge and extend the substrate surface.

The material properties of the surface enlarging means are adjusted to the flexural stiffness as well as bending behaviour of the substrates so far that the thermal and mechanical properties can be regarded as substrate-identical. In particular, it is important that the substrates terminate with a minimum step at the surface enlarging means, so that no sudden changes occur in the flow conditions.

PDMS and other silicones, polyimide and other elastomers which are elastic enough to encircle the substrates in an edgeless manner can be used as the material for the surface enlarging means.

In further embodiments, fibre-reinforced materials can be used for the surface enlarging means. In particular, the radial strengths and shear strengths which the surface enlarging means can nestle onto the substrates can be decoupled from the material elasticity as concentric, linear extension of the elastomers.

Further advantages, features and details of the invention result from the following description of preferred exemplary embodiments, as well as on the basis of the drawings.

BRIEF DESCRIPTION OF THE DRAWINGS

FIG. 2c shows the second device according to the invention in a third process step, FIG. 2d shows the second device according to the invention in a fourth process step, FIG. 2e shows the second device according to the invention in a fifth process step, as well as a pressure-temperature graph, FIG. 3a is a general inversion graph, FIG. 3b shows the inversion graphs for nitrogen, hydrogen and helium, FIG. 4a is a schematic illustration, which is not to scale, of a substrate perimeter with a first type of defect;

FIG. 4b is a schematic illustration, which is not to scale, of a substrate periphery with a second defect type;

FIG. 4c is a schematic illustration, which is not to scale, of a substrate periphery with a third defect type;

FIG. 4d is a schematic illustration, which is not to scale, of a substrate periphery with a fourth type of defect;

FIG. 4e is a schematic illustration, which is not to scale, of a substrate periphery with a fifth defect type;

FIG. 5a is a schematic illustration, which is not to scale, of an alternative embodiment for the expansion surface, FIG. 5b is a schematic illustration, which is not to scale, of a further alternative embodiment for the expansion surface, FIG. 5c is a schematic illustration, which is not to scale, of a further alternative embodiment for the expansion surface, FIG. 5d is a schematic illustration, which is not to scale, of a further alternative embodiment for the expansion surface, FIG. 6a is a schematic, enlarged view, which is not to scale, of a right part of a further substrate holder, FIG. 6b is a schematic enlarged view, which is not to scale, of a right part of a further substrate holder, FIG. 6c is a schematic enlarged view, which is not to scale, of a right part of a further substrate holder, FIG. 6d is a schematic enlarged view, which is not to scale, of a right part of a further substrate holder, FIG. 6e is a schematic enlarged view, which is not to scale, of a right part of a further substrate holder.

DETAILED DESCRIPTION OF THE INVENTION

Figure 1:
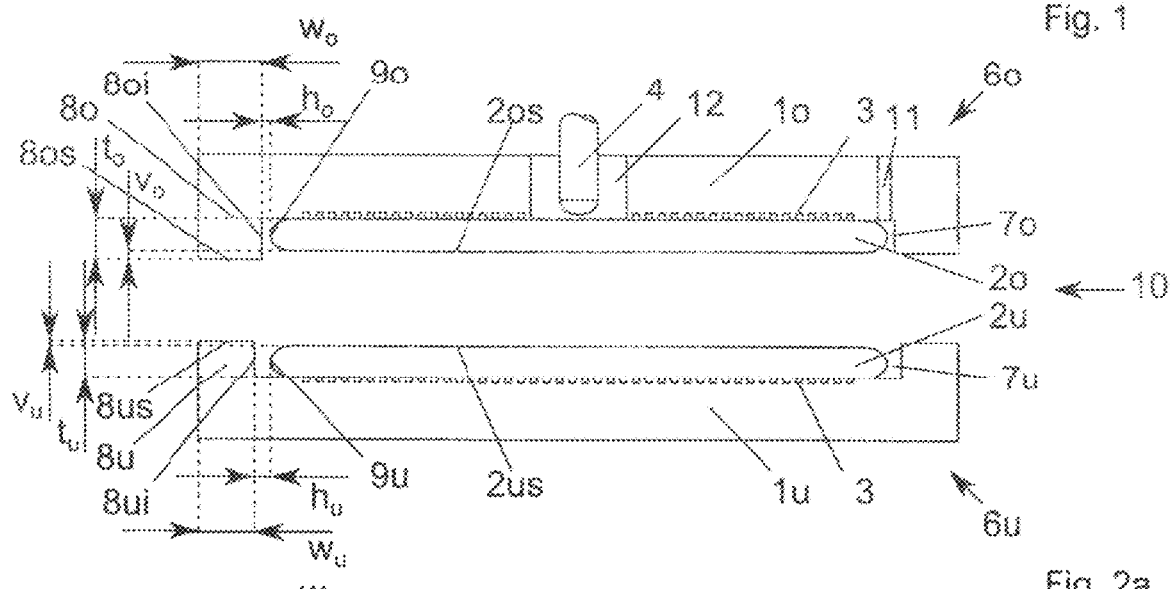
FIG. 1 shows a first device according to the invention.

FIG. 1 shows a schematic first device 10 according to the invention which is not true to scale comprising a first, lower substrate holder 6u, and a second, upper substrate holder 6o. The two substrate holders 6u, 6o include at least one first component 1u, 1o. Fixing elements 3, which are used to fix substrates 2u, 2o, are located on the components 1u, 1o. In the upper component 1o, there is preferably an opening 12 through which a deformation element 4 can move.

The deformation element 4 is used to deform the second upper substrate 2o.

According to the invention, the components 1o, 1u are designed in such a way that they have recesses 7o, 7u in which the substrates 2u, 2o are located. The edge of the first components 1u, 1o has elevations 8u, 80.

The elevations 8u, 8o have internal walls 8ui, 8oi. The interior walls 8ui, 8oi have a height tu, to. The horizontal distances between the inner walls 8ui, 8oi and peripheries 9u, 90 of the substrates 2u, 2o are hu, ho. Furthermore, the elevations 8u, 8o have an expansion surface 8us, 8os according to the invention with a length wu, wo, which widen the substrate surfaces 2us, 2os for transporting the gas beyond the peripheries 9u, 9o.

As a result, according to the invention, the isenthalpic expansion process takes place outside the device 10 according to the invention and not directly outside the substrates 1u, 1o. The problem is thus shifted outwards via the expansion surface 8us, 8os.

The vertical distances between the expansion surfaces 8us, 8os and the substrate surfaces 2us, 2os of the substrates 2u, 2o are vu, vo. In this embodiment according to the invention, the geometries are fixed and cannot be changed. The distances hu, ho, vu, vo were deliberately set too large to increase clarity. In real embodiments, they should be only a few μm, in particular up to max. 1.0 mm, large.

Figure 2A:
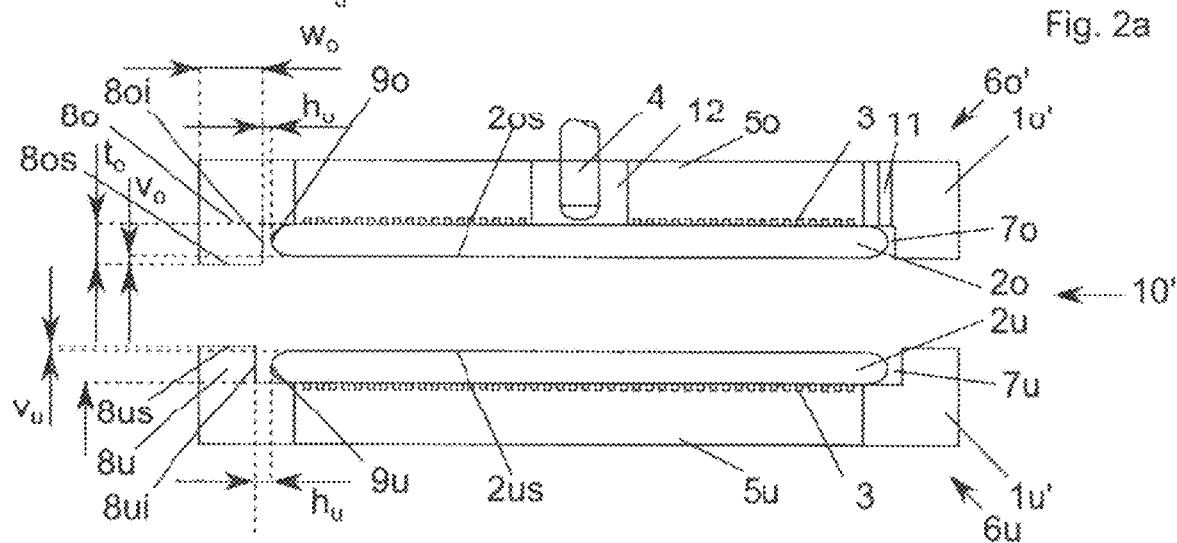
FIG. 2a shows a second device according to the invention in a first process step.

FIG. 2a shows a schematic, improved second inventive device 10', which is not to scale, in a first process step according to the invention, which consists of at least two components 1u', 5u on the underside and/or two components 1u', 5o on the upper side. It is also conceivable that one of the two substrate holders 6u', 6o' is constructed in the same manner as the substrate holders 6u, 6o from FIG. 1. For the sake of simplicity, only the lower substrate holder 6u' will be described.

The lower substrate holder 6u' has a first outer component 1u', in which an inner, second component 5u can move in a translational and/or rotary manner. The relative displacement of the two components 1u' and 5u is used to position the substrate surface 2us relative to the expansion surface 8us. According to the invention, the exiting gas or the exiting gas mixture is to be conducted via the expansion surface Bus from the device 10' according to the invention so that the isenthalpic expansion process does not take place directly on the substrate peripheries 9u, 9o and thus a condensation of gases, in particular water vapour, is prevented by temperature drop. In contrast to the first device 10 according to the invention, however, the position of the substrate surface 2us relative to the expansion surface Bus can be precisely adjusted and thus the fluid flow can be optimized outwards. Similar considerations apply to the upper substrate holder 6o'.

Figure 2B:
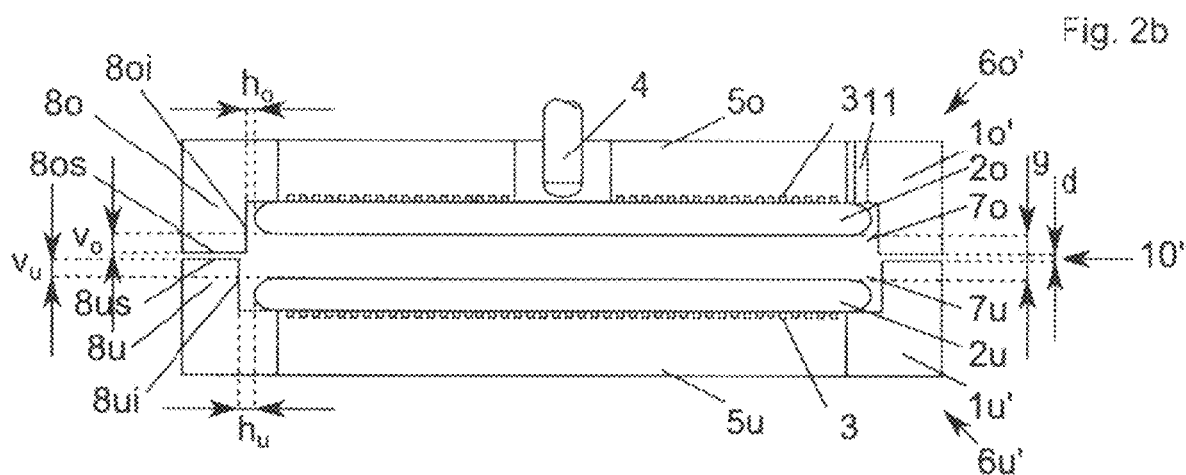
FIG. 2b shows the second device according to the invention in a second process step.

FIG. 2b shows the schematic improved second embodiment 10', which is not to scale, according to the invention in a second process step according to the invention in which the two substrate holders 1u', 1o' were brought closer to one another in such a way that an expansion surface spacing d results. At the same time, a substrate surface gap g exists.

FIG. 2c shows the schematic, non-scale-corrected, improved second embodiment 10', which is not to scale, according to the invention in a third inventive process step, in which the two second components 5u, 5o move translationally such that the substrate surface spacing g decreases to g'. It would also be conceivable that the desired substrate surface spacing g had already been achieved in FIG. 2b, with which the third inventive process step would be optional provided that it is possible to dispense with the optimization of the vertical distances vu, vo.

FIG. 2d shows the schematic, improved second embodiment 10', which is not to scale, according to the invention in a fourth process step according to the invention in which the deformation element 4 deforms the upper substrate 2o and thus starts the bonding process. The upper substrate 2o is detached from the upper substrate holder 6o', in particular by a controlled switching-off of the fixing elements 3.

From this point onwards, a bond wave 13, which is symmetrical in its entirety, is formed, which drives a compressed gas in front of it.

FIG. 2e shows a schematic, enlarged scale illustration of a lateral part of the improved embodiment 10' according to the invention in a fifth process step according to the invention, as well as a pressure (or pressure difference) temperature-position graph.

In this process step, the two substrates 2u, 2o were almost completely joined to one another, with the exception of the edge regions of the substrates 2u, 2o which are relevant according to the invention. The gas displaced by the bond wave 13 can spread over the expansion surfaces 8us, 80s without an isenthalpic expansion into the outer region 14.

Only in the vicinity of the outer region 14 does the isenthalpic expansion occur, which would have led to a cooling and condensation of the gas in the case of negative JTC. By expanding the substrate surfaces 2us, 2os via the expansion surfaces 8us, 80s, the isenthalpic expansion could thus be geometrically delayed.

In the graph, the pressure difference p-p0 is plotted on the left-hand abscissa. The pressure p0 is the ambient pressure in the outer region p0. The ambient pressure p0 corresponds mostly to 1 bar. In general, however, the embodiment according to the invention can itself be installed in a pressure chamber in which an increased ambient pressure can be adjusted. In general, the ambient pressure p0 is less than 10 bar, preferably less than 5 bar, more preferably less than 3 bar, most preferably less than 2 bar, most preferably 1 bar.

The pressure p represents the pressure at the indicated position. The pressure values p lie between 20 bar and p0, preferably between 10 bar and p0, more preferably between 5 bar and p0, most preferably between 3 bar and p0, most preferably between 2 bar and p0.

The different pressure curves 15, 15', 15", 15''' represent the pressure curve for four differently advanced bonding steps. FIG. 2e correlates with the first pressure profile 15. The pressure profile 15" is produced, for example, at a point in time in which the two substrate surfaces 2us, 2os have already been completely bonded to one another.

Although the pressure curves 15, 15' and partial 15" still lie between the substrates, there is no isenthalpic expansion, but only the compression of the gas.

The region of the isenthalpic expansion is advantageously located in the shaded region 17, that is, in all cases outside the substrates 2u, 2o. In this region, a discharged gas can easily condense, since it is no longer on the substrate surfaces 2us, 2os. It can be seen that the pressure curve 15" is located outside the substrates 2u, 2o, in contrast to FIG. 2 of the cited printed document Castex et al., *Mechanism of Edge Bonding Void Formation in Hydrophilie Direct, ECS Solid State Letters*, 2 (6) P47-P50 (2013).

By means of the hole 11, an evacuation and/or a flushing of the interior space of the embodiment 10' according to the invention can be performed, which further reduces the negative effect. Thus, it is conceivable to use a gas which changes the JTC of the gas mixture between the two substrates 2u, 2o such that the isenthalpic expansion leads to heating rather than cooling.

In all the figures shown, inclined inner walls 8ui, 8oi of the elevations 8u, 8o are conceivable, which facilitate the loading of the substrates 2u, 2o. The recess 7u, 7o would then have the form of a truncated cone.

FIG. 3a shows a schematic graph of an inversion curve of an arbitrary gas or gas mixture. The areas with positive JTC (grey) and those with negative JTC (white) can be seen. The graph is a p-T graph.

The gas under consideration therefore has a positive or negative JTC depending on the pressure present and the temperature. If the state parameters pressure and temperature were exactly on the inversion curve, the JTC would be zero. For ideal gases and gas mixtures the JTC is always zero. Only real gases or gas mixtures are therefore considered. In order to produce a heating according to the invention of a gas or of a gas mixture, it must be ensured that the gas or gas mixture is always in the region with a negative JTC. At standard normal conditions, there are only three gases which have a negative JTC, namely, helium, hydrogen, and neon.

FIG. 3b shows a schematic graph of the inversion curves of nitrogen, hydrogen and helium. It can be seen that nitrogen has a positive JTC for standard standard conditions (about 298, 15 K, 1 bar) and will therefore cool down with an isenthalpic expansion. It is therefore also a further aspect according to the invention to take measures according to the invention in the bonding process according to the invention in order to remove gases, in particular atmospheric nitrogen, with a positive JTC as far as possible from the atmosphere and, preferably, entirely by gases with positive JTC. The two gases hydrogen and helium, on the other hand, have inversion curves that lie far below 298, 15K.

Hydrogen and helium, therefore, are heated under is standardized conditions under an isenthalpic expansion and thus counteract a condensation of other gases, in particular water vapour.

FIG. 4a shows a schematic illustration of a substrate periphery 9 having a first defect type 18, which is not true to scale. The first defect type 18 represents a dent.

FIG. 4b shows a schematic illustration of a substrate periphery 9 with a second defect type 18', which is not to scale'. The second defect type 18' represents a substrate surface 2s with high surface roughness.

FIG. 4c shows a schematic illustration of a substrate periphery 9 with a substrate surface 2s on which adsorbed gases, in particular water, are located, which is not to scale. This state actually represents the normal state of most surfaces. With regard to the process according to the invention, this state is nevertheless classified as a third defect type 18". The third defect type 18" thus represents a substrate surface 2s with adsorbed gases, in particular water. The water is, in particular, only present as a monolayer.

FIG. 4d shows a schematic illustration of a substrate periphery 9 having a fourth defect type 18''', which is not true to scale. The fourth defect type 18''' represents a substrate surface 2s with a locally concentrated, condensed gas, in particular water.

FIG. 4e shows a schematic illustration of a substrate periphery 9 with a fifth defect type 18IV, which is not true to scale. The fifth defect type 18IV represents a substrate surface 2s with a particle.

FIG. 5a shows a first widening according to the invention of the elevation 8' with a curved expansion surface 8s', which increases the volume towards the outside.

FIG. 5b shows a second widening according to the invention of the elevation 8" with a curved expansion surface 8s''', which reduces the volume to the outside. This element acts thermodynamically as a throttle valve.

FIG. 5c shows a third extension according to the invention of the elevation 8' "with a curved expansion surface 8s'''", which increases the volume outwards linearly.

FIG. 5d shows a second enlargement according to the invention of the elevation 8IV with a curved expansion surface 8sIV which linearly reduces the volume to the outside. This element acts thermodynamically as a throttle valve.

FIG. 6a shows a schematic, enlarged scale view of a right-hand part of an improved substrate holder 6u in which the production of the constructional features hu, vu has been dispensed with by the introduction of a rounded radius of curvature or bevel radius R. The manufacture of such a transition is much easier and more efficient in terms of construction technology.

The radius of curvature or bevel radius R is, in particular, equal to the radius of curvature of the substrate periphery 9. The person skilled in the art knows that the substrate peripheries 9 in the cross section according to the SEMI standard do not necessarily describe a semi-circle, but can be arbitrarily shaped. For the sake of completeness, it is therefore mentioned that the radius of curvature or bevel radius R is a parameter with the aid of which the best attempt is made to adapt the substrate 2u, in particular its substrate periphery 9, to the lower substrate holder 6u.

For an upper substrate holder 6o, analogous considerations apply where necessary and desired. The deviation between the radius of curvature or bevel radius R and the curvature of the substrate periphery 9 is in particular less than 5%, preferably less than 3%, more preferably less than 2%, most preferably less than 1%, most preferably of all less than 0.1%.

The use of a radius of curvature or bevel radius R can be combined with the use of the distances hu, ho, vu, vo.

FIG. 6b shows a schematic enlarged view of a right-hand part of a further, improved substrate holder 6u in which the elevation 8u' has been designed as a ring which is mounted on the component 1u. The mounting is not explained in more detail here. 8u' can be welded, glued, bonded, screwed riveted etc. with the component 1u.

FIG. 6c shows a schematic enlarged view of a right-hand part of a further, improved substrate holder 6u in which the elevation 8u' has been designed as a ring which is mounted in a step 21 of the component 1u. The mounting is not explained in more detail here. 8u' can be welded, glued, bonded, screwed riveted etc. with the component 1u.

The elevations 8u' designed as rings in FIGS. 6b and 6c are preferably also interchangeable. Thus, a plurality of different rings 8u' can be constructed and, if necessary, exchanged to adjust the elevations 8u' accordingly and optimize them for the process.

FIG. 6d shows a schematic enlarged view of a right-hand part of a further, improved substrate holder 6u in which a nozzle 22 provides an overpressure from outside. Such nozzle systems have also already been mentioned in part in PCT/EP2016053268.

FIG. 6e shows a schematic enlarged view of a right-hand part of a further, improved substrate holder 6u in which the hole 11' has been constructed in such a way that the gas or gas mixture can be flushed directly in the direction of the substrate.

Figure 7:
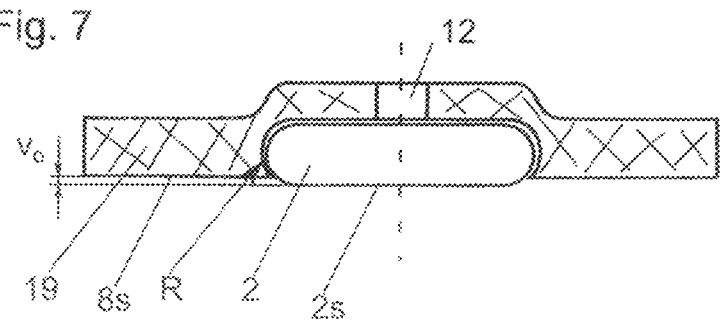
FIG. 7 is a schematic illustration, which is not to scale, of a further embodiment.

FIG. 7 shows an embodiment, which is not to scale, of a first embodiment of a surface enlargement means 19. In this case, a substrate 2 is enclosed by means of the radius of curvature and bevel radius R of the surface enlargement means 19. Between the substrate surface 2s to be bonded and an expansion surface 8s of the surface enlarging means 19, there is a vertical spacing vo, which is preferably less than 10 micrometres, particularly preferably less than 1 micrometre. The substrate surface 2s is expanded by the expansion surface 8s.

Figure 8:
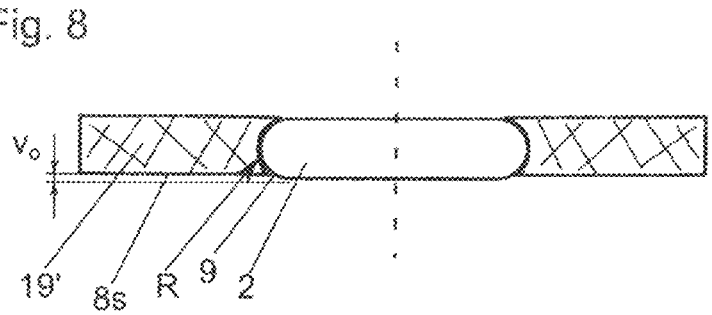
FIG. 8 is a schematic illustration, which is not to scale, of a further embodiment.

FIG. 8 shows a further embodiment which is not true to scale of a surface enlargement means 19'. In this case, compared to FIG. 7, the substrate 2 is merely supported on the outer substrate periphery 9, preferably with a low pressing force. The substrate 2 is thereby completely enclosed. The bevel radius R is intended to surround the outer substrate periphery 9, in particular, perfectly.

In the figures, the same components or components with the same function are labelled with the same reference numbers.

REFERENCE LIST 1, 1u, 1o First/outer component
2, 2u, 2o Substrates
2s, 2us, 2os Substrate surface
3 Fixings
4 Deformation element
5u, 5o Second/inner component
6u, 6u', 6o, 6o' Substrate holder
7o, 7u Recess
8o, 8u, 8u', 8, 8', 8", 8''', 8IV, 8V Elevation
8oi, 8ui Interior wall
8os, 8us, 8s, 8s', 8s", 8s''', 8sIV Expansion surface
9, 9u, 9o Substrate periphery
10, 10' Bonding device
11, 11' Hole
12 Opening
13 Bond wave
14 Outside area
15, 15', 15", 15''' Pressure curve
16 Temperature curve
17 Range of isenthalpic expansion
18, 18', 18", 18''', 18IV Defect
19, 19' Surface enlarging means
20 Rounding
21 Graduation
22 Nozzle
a Angle
d Expansion surface spacing
g Substrate surface spacing
wu, wo Elevation width
tu, to Elevation depth
ho, hu Horizontal distances
vo, vo vu, vu' Vertical distances
P Pressure between the substrates
p0 Ambient pressure
R Radius of curvature or bevel radius

What is claimed is:

1. A device for bonding a first substrate surface of a first substrate to a second substrate surface of a second substrate, said device comprising:
a first substrate holder for accommodating the first substrate, and
a second substrate holder for accommodating the second substrate, wherein the first substrate holder has
a first recess with a fixing device for fixing the first substrate in the first recess,
a first elevation at least partly surrounding the first recess, said first elevation being an interchangeable ring; and
at least one hole communicating with the first recess for flushing an interior space of the device before and/or during and/or after bonding of the first substrate and the second substrate.

2. The device according to claim 1, wherein the at least one hole is for flushing the interior space with a gas and/or a gas mixture.

3. The device according to claim 2, wherein the gas and/or the gas mixture includes helium.

4. The device according to claim 1, wherein the at least one hole is arranged in a symmetrically distributed manner.

5. The device according to claim 1, wherein the first elevation is formed annularly around the first recess.

6. The device according to claim 1, wherein the first substrate holder has an outer component and an inner component movable in the outer component, wherein the outer and/or the inner component is translationally and/or rotatably movable, and the outer and inner components are fixable to one another.

7. The device according to claim 6, wherein the at least one hole is arranged in a symmetrically distributed manner in the inner component.

8. The device according to claim 1, wherein the second substrate holder has a second recess with a fixing device for fixing the second substrate in the second recess, and a second elevation at least partly surrounding the second recess.

9. The device according to claim 1, wherein the first elevation has an inwardly and/or outwardly bevelled extension surface at an angle (a).

10. The method for bonding a first substrate surface of a first substrate to a second substrate surface of a second substrate by means of a device according to claim 1, wherein a gas arranged between the first and second substrate surfaces during the bonding process is displaced from a centre to an edge of the first and second substrates, wherein the method includes:
flushing an interior space of the device with a gas and/or gas mixture through the at least one hole before and/or during and/or after the bonding of the first substrate and the second substrate.

11. The method according to claim 10, wherein the gas and/or the gas mixture includes helium.

* * * * *